United States Patent [19]

Ikeda

[11] Patent Number: 4,542,306
[45] Date of Patent: Sep. 17, 1985

[54] BUFFER CIRCUITS FOR USE WITH SEMICONDUCTOR MEMORY DEVICES

[75] Inventor: Hiroaki Ikeda, Tokyo, Japan

[73] Assignee: Nippon Electric Co., Ltd., Tokyo, Japan

[21] Appl. No.: 463,338

[22] Filed: Feb. 2, 1983

[30] Foreign Application Priority Data

Feb. 3, 1982 [JP] Japan .................................. 57-16121

[51] Int. Cl.$^4$ .................... H03K 17/687; G11C 11/40
[52] U.S. Cl. .................................. 307/443; 307/269; 307/481; 307/353; 307/272 A; 307/575; 307/279
[58] Field of Search ............... 307/443, 448, 453, 269, 307/480–482, 572, 575, 577–578, 582–584, 272 A, 279, 291, 353; 365/233

[56] References Cited

U.S. PATENT DOCUMENTS

| | | | |
|---|---|---|---|
| 4,238,841 | 12/1980 | Clemen et al. | 307/279 X |
| 4,354,257 | 10/1982 | Varshney et al. | 307/269 X |
| 4,396,845 | 8/1983 | Nakano | 307/578 X |
| 4,397,000 | 8/1983 | Nagami | 307/575 X |
| 4,417,163 | 11/1983 | Otsuki et al. | 307/482 X |
| 4,441,039 | 4/1984 | Schuster | 307/279 X |

Primary Examiner—Stanley D. Miller
Assistant Examiner—D. R. Hudspeth
Attorney, Agent, or Firm—Blakely, Sokoloff, Taylor & Zafman

[57] ABSTRACT

In a buffer circuit for producing two output signals of the opposite phases in response to an input signal comprising a pre-circuit producing two pre-output signals in accordance with the input signal and a reference voltage signal; and a main circuit including a latch circuit latching the pre-output signals, and a flip-flop circuit connected to receive the pre-output signals latched by the latch circuit for producing the output signals of the buffer circuit, there is provided a transfer gate circuit enabled by the pre-output signals and disabled by the output signals of the buffer circuit. According to this invention, different from the prior art circuit, it is not necessary to use any clock signal having a high level at the time of operation of the buffer circuit and to have strict time spacing, whereby the clock signal generator can be simplified and the buffer circuit can be miniaturized and its operating speed can be increased.

7 Claims, 5 Drawing Figures

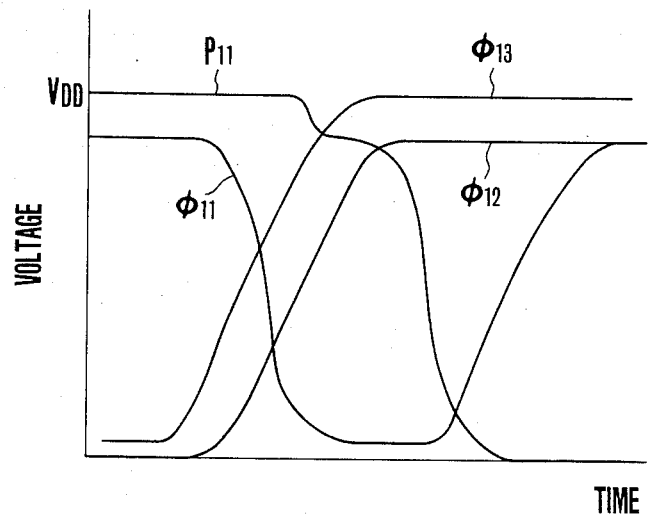
F I G. 2
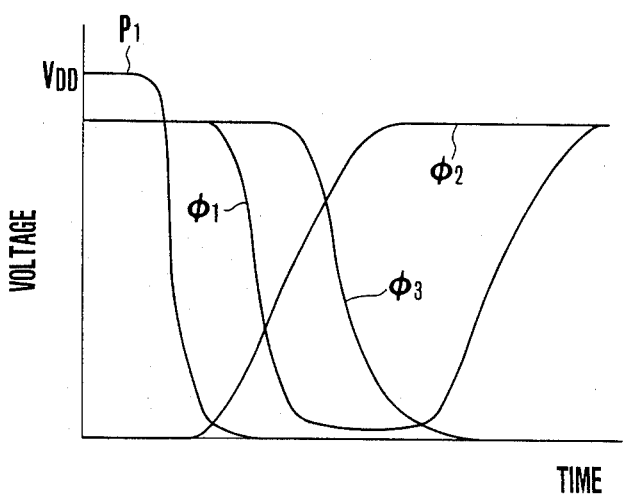
F I G. 5

BUFFER CIRCUITS FOR USE WITH SEMICONDUCTOR MEMORY DEVICES

BACKGROUND OF THE INVENTION

This invention relates to a buffer circuit.

A buffer circuit which produces two output signals having opposite phases (hereinafter termed opposite output signals) in response to a single input signal is constructed to compare the input signal with a predetermined reference voltage signal for obtaining two opposite output signals and is important as a buffer element between an input circuit and an internal circuit in various electronic circuits. As the capacity of memory devices increases and as their operating speed increases, so an address buffer circuit for use with semiconductor memory devices becomes important. For this reason, in the following description, an address buffer circuit utilized in a semiconductor memory device is taken as a typical example.

An address buffer circuit is used in a semiconductor memory device for sending an address selection designation signal to a decoding circuit in accordance with an address input signal, and it is required in such an address buffer circuit that it accurately determine a designated address and operate at a high sensitivity and high speed, that its power consumption be small, that it includes a signal generating circuit, and that it can be designed readily and reduced in size for miniaturization of the chip.

Various circuits have been proposed which meet these requirements. FIG. 1 shows one example of the most advanced prior art circuit.

The circuit shown in FIG. 1 comprises a pre-circuit 11 essentially constituted by a flip-flop circuit which is made up of enhancement type field effect transistors (E-FET) $Q_{31}$ and $Q_{32}$ and which compares a single input signal $A_I$ with a predetermined reference voltage signal $V_{REF}$ to produce two opposite pre-output signals $A'_o$ and $A'_o$, and a main circuit 12 essentially constituted by another flip-flop circuit made up of E-FETs $Q_{41}$ and $Q_{42}$ acting as a transfer gate which transfers the pre-output signals $A'_o$ and $A'_o$ according to a clock signal $P_{11}$, and E-FETs $Q_{47}$ and $Q_{48}$ which produce two opposite output signals $A_o$ and $A_o$ when supplied with the pre-output signals $A'_o$ and $A'_o$. One of the characteristic features of this circuit lies in that depletion type field effect transistors (D-FET) $Q_{33}$, $Q_{34}$, $Q_{35}$ and $Q_{36}$ are used in the pre-circuit. The operation of this circuit will be outlined as follows.

The operation of the pre-circuit will first be described. According to a clock signal $\phi_{11}$, the input signal $A_I$ giving an address input and the reference voltage signal $V_{REF}$ are applied to nodes $N_{13}$ and $N_{14}$ via E-FETs (in the following merely designated as FET except D-FET) $Q_{37}$ and $Q_{38}$. While latching the applied signals by the clock signal $\phi_{11}$, a clock signal $\phi_{12}$ rises to raise the potential of these nodes $N_{13}$ and $N_{14}$ by the action of bootstrap capacitances $C_{11}$ and $C_{12}$. As a consequence, the conductivity of each of D-FETs $Q_{35}$ and $Q_{36}$ is caused to vary by the applied input signal $A_I$ and reference voltage signal $V_{REF}$. Such a change is detected by the flip-flop circuit constituted by FETs $Q_{31}$ and $Q_{32}$ by making a clock signal $\phi_{11}$ low level which appears at nodes $N_{11}$ and $N_{12}$ and is then sent out to the main circuit 12 as the pre-output signals $A'_o$ and $A'_o$ via FETs $Q_{39}$ and $Q_{40}$. If the clock signal $\phi_{11}$ is still at a low level even after detection by the flip-flop circuit, the D-FETs $Q_{33}$ and $Q_{34}$ on the load side would be turned ON, thereby increasing power consumption. Accordingly, a one shot reverse phase signal as shown in FIG. 2 is used as the clock signal $\phi_{11}$. Since the clock signal $\phi_{11}$ is a one shot reverse phase signal, as the clock signal $\phi_{11}$ rises again, the nodes $N_{11}$ and $N_{12}$ will be precharged through D-FETs $Q_{33}$ and $Q_{34}$ again, whereby their address determination information at the nodes $N_{11}$ and $N_{12}$ would be lost, and levels at the nodes $N_{15}$ and $N_{16}$ would be also lost. Thus, the FETs $Q_{41}$ and $Q_{42}$ are provided for the purpose of preventing such loss by separating the nodes $N_{15}$ and $N_{16}$ from the nodes $N_{11}$ and $N_{12}$ which are kept at high potential levels. The FETs $Q_{41}$ and $Q_{42}$ act as a transfer gate so that pre-output signals $A'_o$ and $A'_o$ are applied to nodes $N_{15}$ and $N_{16}$ in the main circuit 12 in accordance with a clock signal $P_{11}$ and then detected by the flip-flop circuit comprising FETs $Q_{47}$ and $Q_{48}$. The detected signals are outputted as output signals $A_o$ and $A_o$ from output terminals 15 and 16. The circuit constituted by FETs $Q_{43}$, $Q_{45}$ and $Q_{44}$ and $Q_{46}$ is an output level ensuring circuit which produces an output having the same level as that of a clock signal $\phi_{13}$ by bringing the potential levels of nodes $N_{17}$ and $N_{18}$ up to the levels above the level of the clock signal $\phi_{13}$ by self-boost effect caused by gate-source capacitances of FETs $Q_{45}$ and $Q_{46}$. The FETs $Q_{49}$ and $Q_{50}$ are provided for the purpose of preventing a low level floating in which a low level one of the pre-output signals $A'_o$ and $A'_o$ is maintained directly by a high level one of the output signals $A_o$ and $A'_o$ to turn ON one receiving such high level signal of FETs $Q_{49}$ and $Q_{50}$.

As described above, although this prior art circuit is advantageous in that its main circuit 12 is simple and compact in construction, it still involves the following problems. For example, the output information of the pre-circuit 11 which is transmitted to the nodes $N_{15}$ and $N_{16}$ is directly controlled by the output signals $A_o$ and $A_o$ through FETs $Q_{49}$ and $Q_{50}$. When the output signals $A_o$ and $A_o$ float, the outputs at the nodes $N_{15}$ and $N_{16}$ are lost. Consequently, as shown in FIG. 2, this circuit is inherently sensitive to mutual differences in timing between clock signals $\phi_{11}$, $P_{11}$ and $\phi_{13}$. For example, should the clock signal $P_{11}$ becomes a low level before the clock signal $\phi_{11}$ becomes sufficiently low level, the main circuit would be disconnected from the pre-circuit before the address information is determined by the main circuit. This requires the clock signal generator to ensure correct timing. Such ensurance can be attained by increasing the time spacing (i.e. lowering frequency) but such expedient prevents high speed operations. Furthermore, as the clock signal $\phi_{13}$ is required not only to directly maintain the output signal level, but also to drive a decoder circuit constituting the load of the address buffer circuit, it becomes necessary to provide a high power clock signal generating circuit having a high level of $V_{DD}$. Such a circuit is complicated and uses large transistors, thereby preventing miniaturization of the chip.

Other prior art circuits also, require a clock signal that rises to the $V_{DD}$ source voltage level at the time of detection. In addition, there is the problem of time spacing described above. Accordingly, the requirement for clock signal generating circuit is severe, which makes it complex and difficult to design the circuit and prevents miniaturization of the circuit and high speed operation thereof.

SUMMARY OF THE INVENTION

Accordingly, it is an object of this invention to provide an improved buffer circuit in which the requirements for the voltage and time spacing of clock signals necessary for proper operation are not so severe as in the prior art buffer circuit so that the clock signal generating circuit can be designed readily to have a compact size and can operate at a high speed.

According to this invention, there is provided a buffer circuit which produces two output signals of opposite phases in response to an input signal, characterized in that there are provided a pre-circuit producing two pre-output signals in accordance with the input signal and a reference voltage signal; and a main circuit including a transfer gate circuit enabled by the pre-output signals and disabled by the output signals of the buffer circuit, a latch circuit latching the pre-output signals, and a flip-flop circuit connected to receive the pre-output signals latched by the latch circuit for producing the output signals of the buffer circuit.

BRIEF DESCRIPTION OF THE DRAWINGS

In the accompanying drawings:

FIG. 2 shows waveforms of clock signal voltages utilized in the circuit shown in FIG. 1;

FIG. 5 shows waveforms of the clock signal voltages utilized in the circuit shown in FIG. 3.

DESCRIPTION OF THE PREFERRED EMBODIMENT

Figure 3:
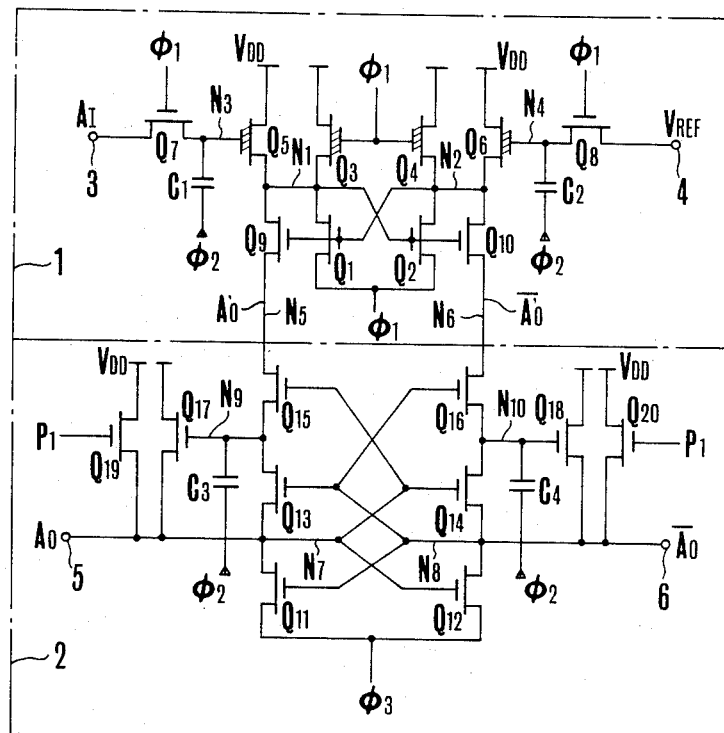
FIG. 3 is a connection diagram showing one embodiment of the buffer circuit according to this invention.

A preferred embodiment of the buffer circuit of this invention illustrated in FIG. 3 is constituted by a pre-circuit 1 which produces two opposite pre-signals $A'_o$ and $A'_o$ in response to an address designation input signal $A_I$ impressed upon an input terminal 3 and a reference voltage signal $V_{REF}$ impressed upon a reference voltage terminal 4, and a main circuit 2 supplied with the pre-output signals $A'_o$ and $A'_o$ for performing an address judgement to produce two output signals $A_o$ and $A_o$ of opposite phases and having predetermined levels.

Figure 1:
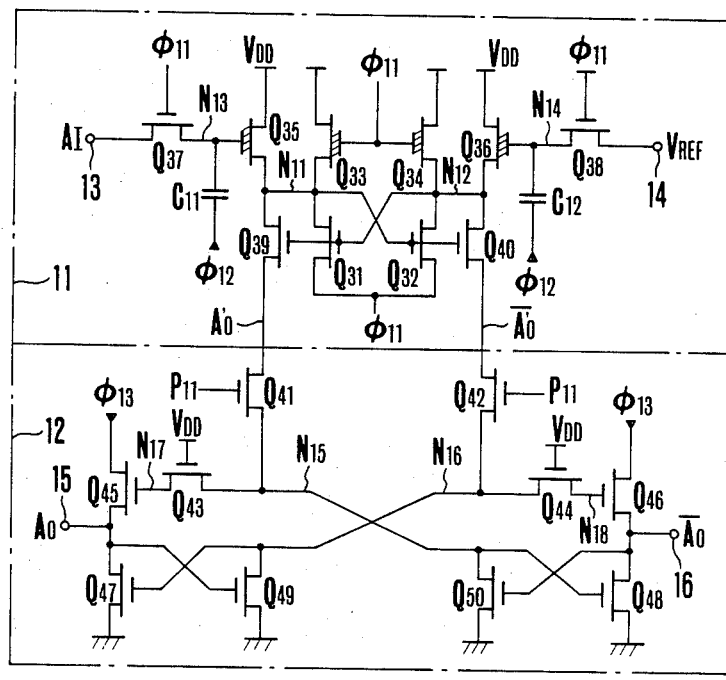
FIG. 1 shows a connection diagram of a prior art buffer circuit.

The pre-circuit 11 has the same construction as that 11 shown in FIG. 1. More particularly, the pre-circuit 1 is constituted by FETs $Q_1$ and $Q_2$ which form a flip-flop circuit cross-connected at nodes $N_1$ and $N_2$, with their source electrode common junction driven by a clock signal $\phi_1$, D-FETs $Q_3$ and $Q_4$ respectively connected between the FETs $Q_1$ and $Q_2$ and a $V_{DD}$ source terminal with their gate electrodes commonly interconnected to be driven by the clock signal $\phi_1$, D-FETs $Q_5$ and $Q_6$ respectively connected between the nodes $N_1$ and $N_2$ and the $V_{DD}$ source terminal, FETs $Q_7$ and $Q_8$ respectively having drain electrodes for forming nodes $N_3$ and $N_4$ together with the gate electrodes of the D-FETs $Q_5$ and $Q_6$, the gate electrodes of FETs $Q_7$ and $Q_8$ being driven by the clock signal $\phi_1$ and the source electrodes of the FETs $Q_7$ and $Q_8$ being connected to the input signal terminal 3 and the reference voltage signal terminal 4, respectively, bootstrap capacitors $C_1$ and $C_2$ respectively connected to the nodes $N_3$ and $N_4$ to be driven by a clock signal $\phi_2$, and FETs $Q_9$ and $Q_{10}$ with their drain electrodes connected to the nodes $N_1$ and $N_2$, the gate electrodes commonly connected to the gate electrodes of FETs $Q_1$ and $Q_2$ and source electrode acting as output nodes $N_5$ and $N_6$ of the pre-output signals $A'_o$ and $A'_o$.

The main circuit 2 is constituted by FETs $Q_{11}$ and $Q_{12}$ cross-connected at nodes $N_7$ and $N_8$ to form a flip-flop circuit, the nodes $N_7$ and $N_8$ forming output terminals 5 and 6 of output signals $A_o$ and $A_o$ respectively; FETs $Q_{13}$ and $Q_{14}$ with their source electrodes connected to nodes $N_7$ and $N_8$ and gate electrodes connected to nodes $N_8$ and $N_7$ respectively; FETs $Q_{15}$ and $Q_{16}$ with their source electrodes connected to the drain electrodes of FETs $Q_{13}$ and $Q_{14}$ respectively, drain electrodes connected to source electrodes of FETs $Q_9$ and $Q_{10}$ for forming the nodes $N_5$ and $N_6$ acting as output and input terminals of the pre-output signals $A'_o$ and $A'_o$, and the gate electrodes connected to the gate electrodes of FETs $Q_{14}$ and $Q_{13}$ respectively; FETs $Q_{17}$ and $Q_{18}$ with their source electrodes connected to the nodes $N_7$ and $N_8$ respectively, drain electrodes connected to the $V_{DD}$ source terminal, and gate electrodes connected to drain electrodes of FETs $Q_{13}$ and $Q_{14}$ to form nodes $N_9$ and $N_{10}$; bootstrap capacitors $C_3$ and $C_4$ respectively connected to the nodes $N_9$ and $N_{10}$ and driven by a clock signal $\phi_2$; and FETs $Q_{19}$ and $Q_{20}$ with their source electrodes connected to the nodes $N_7$ and $N_8$, drain electrodes connected to the $V_{DD}$ source terminal, and gate electrodes connected to be driven by a clock signal $P_1$. The flip-flop circuit comprised of the FETs $Q_{11}$ and $Q_{12}$ is connected to receive a clock pulse $\phi_3$.

Figure 4:
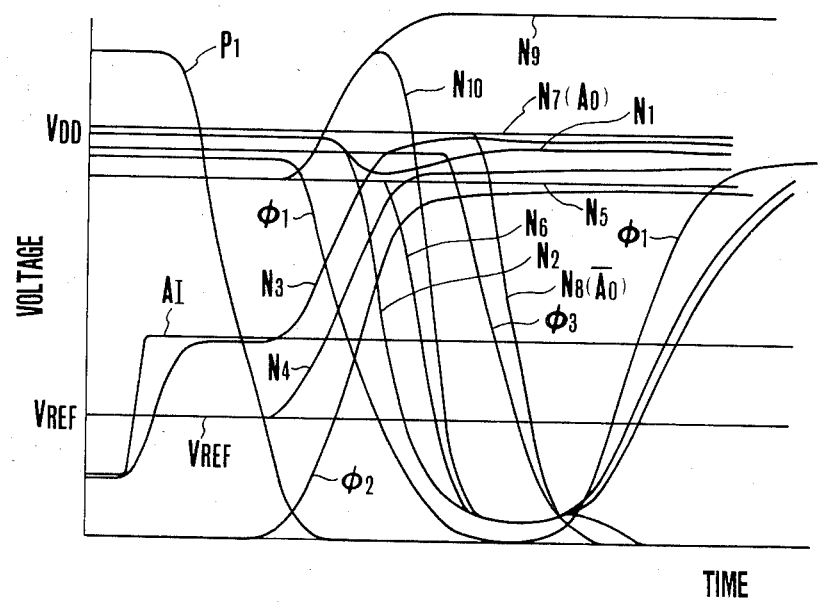
FIG. 4 shows waveforms of node potentials and clock signal voltages of the circuit shown in FIG. 3.

The operation of the embodiment shown in FIG. 3 will now be described with reference to the node potentials and clock signal voltages shown in FIG. 4. For the sake of description, it is assumed that the input signal $A_I$ is at a high level.

Firstly, the level of the clock signal $P_1$ is raised to the level of $V_{DD}$, if necessary, higher than $V_{DD}$ to precharge the output nodes $N_7$ and $N_8$ to a sufficiently high level and the levels of the clock signals $\phi_1$ and $\phi_2$ are raised to a level slightly lower than that of the $V_{DD}$. The input signal $A_I$ at the high level and the reference voltage signal $V_{REF}$ are applied to respective input terminals 3 and 4. Accordingly, both FETs $Q_7$ and $Q_8$ are turned ON to apply the input signal $A_I$ to the node $N_3$ and the reference voltage signal $V_{REF}$ to the node $N_4$. Also the nodes $N_1$ and $N_2$ are precharged to the level of source $V_{DD}$ by the D-FETs $Q_3$ and $Q_4$, and the flip-flop circuit constituted by FETs $Q_1$ and $Q_2$ is in an inoperative state. On the other hand, in the main circuit, FETs $Q_{19}$ and $Q_{20}$ are turned ON to precharge the nodes $N_7$ and $N_8$ to the level of the source voltage $V_{DD}$, with the result that FETs $Q_{13}$ and $Q_{14}$ are turned ON to precharge the nodes $N_9$ and $N_{10}$ to the level of the source voltage $V_{DD}$. Thus, FETs $Q_{15}$ and $Q_{16}$ acting as a transfer gate are turned OFF since nodes $N_5$ and $N_6$ are charged to a high potential through FETs $Q_9$ and $Q_{10}$, whereby the pre-circuit is disconnected from the main circuit.

Then, the level of the clock signal $P_1$ is lowered (to source potential $V_{SS}$ or ground potential), the clock signal $\phi_2$ is raised to a level slightly lower than that of the source voltage $V_{DD}$ and the clock signal $\phi_1$ is lowered to a low level. Accordingly, the nodes $N_3$ and $N_4$ are raised to high potentials by way of the bootstrap capacitors $C_1$ and $C_2$ to make different the capability of D-FETs $Q_5$ and $Q_6$, which changes the potentials of the nodes $N_1$ and $N_2$. The difference is judged by the flip-flop circuit constituted by FETs $Q_1$ and $Q_2$ and the result of judgement appears at the output nodes $N_5$ and $N_6$ of the pre-circuit via FETs $Q_9$ and $Q_{10}$ as the pre-output signals $A'_o$ and $\bar{A}'_o$. On the other hand, in the main circuit, the potentials of nodes $N_9$ and $N_{10}$ are raised to levels higher than the level of the source voltage $V_{DD}$ by the clock signal $\phi_2$ through the medium of the bootstrap capacitors $C_3$ and $C_4$.

Under this state, when the pre-output signals $A'_o$ and $\bar{A}_o$ from the pre-circuit appear at nodes $N_5$ and $N_6$, the FET $Q_{16}$ on the lower level side (since at this time the input signal $A_I$ is at the high level, signal $A'_o$ is at the low level) acting as a transfer gate is turned ON to lower the potential of the node $N_{10}$ to a low level. As a consequence, the capability of FETs $Q_{17}$ and $Q_{18}$ is greatly varied whereby the potentials of nodes $N_7$ and $N_8$ vary correspondingly. In other words, the output signals $A'_o$ and $\bar{A}'_o$ of the pre-circuit are latched by FETs $Q_{17}$ and $Q_{18}$. The potential level difference at nodes $N_7$ and $N_8$ is amplified and judged by the flip-flop circuit constituted by FETs $Q_{11}$ and $Q_{12}$ by lowering the level of the clock signal $\phi_3$ from high to low level to produce output signals $A_o$ and $\bar{A}_o$ (in this case, $A_o$ is the low level signal) at the output terminals 5 and 6, respectively, and these output signals are positively fedback to the nodes $N_9$ and $N_{10}$ respectively through FETs $Q_{13}$ and $Q_{14}$. As the output node $N_8$ becomes the low level, the FET $Q_{16}$ automatically turns OFF since the potential of node $N_{10}$ is lowered as a result of turning ON of FET $Q_{14}$ due to the high potential of node $N_7$, whereby the pre-circuit and the main circuit are disconnected again. Consequently, even when the potential of the clock signal $\phi_1$ is increased for the purpose of preventing increase in the power consumption caused by turning ON D-FETs $Q_3$ and $Q_4$ after the judgement effected in the pre-circuit 1, the main circuit 2 will not be influenced. FIG. 5 shows only the clock signals among various waveforms shown in FIG. 4 and the clock signals are depicted to correspond to those shown in FIG. 2.

As described above, the circuit of this embodiment requires 4 clock signals $P_1$, $\phi_1$, $\phi_2$ and $\phi_3$ as shown in FIG. 5 just in the same manner as in the prior art. However, signal $P_1$ is used to precharge the output nodes $N_7$ and $N_8$ to a suitable potential, and may simply be of the same level as that of the source voltage $V_{DD}$ or more, if necessary. Accordingly, different from the clock signal $P_{11}$ necessary for directly driving the transfer gate as in the prior art, the clock signal $P_1$ is not required to have a high level like $V_{DD}$ and a strictly defined time spacing (see FIG. 2). The clock signal $\phi_1$ is a one shot opposite phase signal like the prior art for the purpose of decreasing the power consumption caused by the turning ON of the D-FETs $Q_3$ and $Q_4$ in the pre-circuit after the address judgement. The clock signal $\phi_2$ is used to drive the bootstrap capacitors $C_1$, $C_2$, $C_3$ and $C_4$ for raising the potentials of nodes $N_3$, $N_4$, $N_9$ and $N_{10}$. According to this invention, although the number of the nodes whose potentials are to be increased by 2 as compared to the prior art circuit, the high level is lower than that of the source voltage $V_{DD}$, thus causing no problem. The clock signal $\phi_3$ is used to activate the flip-flop circuit comprising FETs $Q_{11}$ and $Q_{12}$ for judging the address level and its level is changed from a level slightly lower than that of $V_{DD}$ to a much lower level, without requiring any special change. For this reason, in the circuit shown in FIG. 3, it is not necessary to use the strictly defined signal $\phi_{13}$ (shown in FIG. 2) adapted to directly drive a load, which signal is required to have strict time spacings with respect to other signals as in the prior art circuit, and further required to have a higher level than $V_{DD}$ sufficient to self-boot the nodes $N_{17}$ and $N_{18}$ (see FIG. 1) to above $V_{DD}$.

Thus, according to the circuit shown in FIG. 3, among various clock signals, the one necessary for the activation during judgement is not required to have strict voltage and time spacing so that it is not necessary to enlarge the time spacing, to use a complicated circuit or large capacity transistors. Thus, the clock signal generating circuit can be readily designed, thus ensuring miniaturization and high speed operation of the memory circuit.

Although, in the foregoing embodiment, the buffer circuit has been described by way of an address buffer circuit for a semiconductor memory device, the invention may also be applied to any circuit of a similar type.

As described above, the buffer circuit of this invention is constituted by a pre-circuit producing two pre-output signals having opposite phases in response to an input signal; and a main circuit comprising a transfer gate circuit enabled by the pre-output signal and disabled by the output of the buffer circuit, a latch circuit for latching the pre-output signals, and a flip-flop circuit supplied with the pre-output signals latched by the latch circuit. As a consequence, different from the prior art circuit, it is not necessary to use any clock signal required to have high levels equal to the level of the source voltage $V_{DD}$ and strict time spacing during the activation (judging operation) of the circuit, thereby simplifying the design of the clock signal generating circuit, miniaturizing the entire circuit and increasing the operating speed.

What is claimed is:

1. In a buffer circuit for producing two output signals of opposite phases in response to an input signal comprising a pre-circuit producing two pre-output signals in accordance with said input signal and a reference voltage signal; and a main circuit including output nodes, a sample and hold circuit for sampling and holding said pre-output signals, and a flip-flop circuit connected to receive said pre-output signals for producing the output signals of the buffer a circuit, the improvement wherein said main circuit comprises a transfer gate circuit enabled by said pre-output signals and disabled by said output signals of the buffer circuit.

2. A buffer circuit according to claim 1 wherein said main circuit comprises a control circuit responsive to said pre-output signal to disable, in the presence of a clock signal for pre-charging the output nodes of the main circuit, the transfer gate circuit when said input signal and reference voltage are of the same level and enable, in the absence of the pre-charging clock signal, the transfer gate circuit when said input signal and reference voltage are of different levels.

3. A buffer circuit according to claim 1 wherein said transfer circuit comprises a first pair of field effect transistors with their source electrodes connected to one output node and the other output node of the main circuit, respectively, and gate electrodes connected respectively to said other node and said one node; a second pair of field effect transistors with their source electrodes connected to the drain electrodes of the first pair of field effect transistors with their source electrodes connected to the drain electrodes of the first pair of field effect transistors, drain electrodes connected to receive said pre-output signals, and gate electrodes connected to the gate electrodes of the first pair of field effect transistors; and bootstrap capacitors respectively connected at one end to the node between the drain electrode of the first pair of field effect transistors and the source electrode of the second pair of field effect transistors and to a terminal for receiving a bootstrap signal at a second end.

4. A buffer circuit comprising first and second input nodes, a flip-flop circuit having first and second input/output nodes, means for operatively charging said first and second input/output nodes with a predetermined potential, a first series circuit of the drain-source current paths of first and second field effect transistors, a second series circuit of the drain-source current paths of third and fourth field effect transistors, said first series circuit being connected between said first input node and said first input/output node, said second series circuit being connected between said second input node and said second input/output node, means for connecting the gates of said first and fourth transistors to said first input/output node, and means for connecting the gates of said second and third transistors to said second input/output node.

5. A buffer circuit according to claim 4, further comprising a fifth field effect transistor having its drain-source current path coupled between a power voltage terminal and said first input/output node and having a gate coupled to the intermediate junction of said first series circuit, and a sixth field effect transistor having its drain-source current path coupled between said power voltage terminal and said second input/output node and having a gate coupled to the intermediate junction of said second series circuit.

6. A buffer circuit according to claim 4, further comprising a pre-circuit for generating true and complementary signals as a result of comparing an input signal with a reference voltage, and means for applying said true and complimentary signals to said first and second input nodes.

7. A buffer circuit according to claim 5, further comprising a first capacitor coupled to said intermediate junction of said first series circuit at one end, a second capacitor coupled to said intermediate junction of said second series circuit at one end, and means for applying a clock signal to the other ends of said first and second capacitors.

* * * * *

UNITED STATES PATENT AND TRADEMARK OFFICE
CERTIFICATE OF CORRECTION

PATENT NO. : 4,542,306  Page 1 of 3
DATED : Sep. 17, 1985
INVENTOR(S) : Ikeda

It is certified that error appears in the above-identified patent and that said Letters Patent is hereby corrected as shown below:

| COLUMN | LINE | DESCRIPTION |
|---|---|---|
| 1 | 43 | Delete "$A'_o$" (second reference) and insert --$\overline{A}'_o$--. |
| 1 | 45 | Delete "$A_o$" (second reference) and insert --$\overline{A}_o$--. |
| 1 | 46 | Delete "$A'_o$" (second reference) and insert --$\overline{A}'_o$--. |
| 1 | 66 | Delete "$A'_0$" (second reference) and insert --$\overline{A}'_o$--. |
| 2 | 15 | Delete "$A'_o$" (second reference) and insert --$\overline{A}'_o$--. |
| 2 | 19 | Delete "$A_o$" (second reference) and insert --$\overline{A}_o$--. |
| 2 | 29 | Delete "$A'_o$" (second reference) and insert --$\overline{A}'_o$--. |

UNITED STATES PATENT AND TRADEMARK OFFICE
CERTIFICATE OF CORRECTION

PATENT NO. : 4,542,306

DATED : Sep. 17, 1985

INVENTOR(S) : Ikeda

It is certified that error appears in the above-identified patent and that said Letters Patent is hereby corrected as shown below:

| COLUMN | LINE | DESCRIPTION |
| --- | --- | --- |
| 2 | 30 | Delete "$A'_o$" (second reference) and insert --$\bar{A}'_o$--. |
| 2 | 39 | Delete "$A'_o$" (second reference) and insert --$\bar{A}'_o$--. |
| 2 | 40 | Delete "$A_o$" (second reference) and insert --$\bar{A}_o$--. |
| 3 | 41 | Delete "$A'_o$" and insert --$\bar{A}'_o$--. |
| 3 | 45 | Delete "$A'_o$" (second reference) and insert --$\bar{A}'_o$--. |
| 3 | 47 | Delete "$A_o$" and insert --$\bar{A}_o$--. |
| 4 | 5 | Delete "$A'_o$" (second reference) and insert --$\bar{A}'_o$--. |
| 4 | 9 | Delete "$A_o$" and insert --$\bar{A}_o$--. |

UNITED STATES PATENT AND TRADEMARK OFFICE
CERTIFICATE OF CORRECTION

PATENT NO. : 4,542,306
DATED : Sep. 17, 1985
INVENTOR(S) : Ikeda

It is certified that error appears in the above-identified patent and that said Letters Patent is hereby corrected as shown below:

| COLUMN | LINE | DESCRIPTION |
|---|---|---|
| 4 | 18 | Delete "$A'_o$" and insert --$\overline{A}'_o$--. |
| 5 | 4 | Delete "$A'_o$" (second reference) and insert --$\overline{A}'_o$--. |
| 5 | 10 | Delete "$A_o$" and insert --$\overline{A}_o$--. |
| 5 | 12 | Delete "$A'_o$" and insert --$\overline{A}'_o$--. |
| 5 | 18 | Delete "$A'_o$" (second reference) and insert --$\overline{A}'_o$--. |
| 5 | 23 | Delete "$A_o$" (second reference) and insert --$\overline{A}_o$--. |

Signed and Sealed this

Twenty-ninth Day of July 1986

[SEAL]

Attest:

DONALD J. QUIGG

Attesting Officer

Commissioner of Patents and Trademarks